United States Patent
Hsu et al.

(10) Patent No.: US 11,313,883 B2
(45) Date of Patent: Apr. 26, 2022

(54) PROBE STATION CAPABLE OF MAINTAINING POSITION OF PROBE TIP UPON TEMPERATURE CHANGE

(71) Applicant: MPI Corporation, Hsinchu County (TW)

(72) Inventors: Yu-Hsun Hsu, Hsinchu County (TW); Jhih-Wei Fang, Hsinchu County (TW); Sebastian Giessmann, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 0 days.

(21) Appl. No.: 17/016,409

(22) Filed: Sep. 10, 2020

(65) Prior Publication Data
US 2022/0074972 A1  Mar. 10, 2022

(51) Int. Cl.
*G01R 1/44*    (2006.01)
*G01R 1/073*   (2006.01)

(52) U.S. Cl.
CPC .......... *G01R 1/44* (2013.01); *G01R 1/07342* (2013.01)

(58) Field of Classification Search
None
See application file for complete search history.

(56) References Cited

U.S. PATENT DOCUMENTS

| 8,327,727 B2 * | 12/2012 | Caudill | G01R 1/06755 73/866.5 |
| 2004/0036490 A1 * | 2/2004 | Schaeffer | G01R 31/2886 324/750.25 |
| 2005/0258848 A1 * | 11/2005 | Schaeffer | G01R 1/07392 324/750.03 |

* cited by examiner

*Primary Examiner* — Douglas X Rodriguez
(74) *Attorney, Agent, or Firm* — CKC & Partners Co., LLC

(57) ABSTRACT

A probe station includes a base, a adaptor, a probe holder and a probe. The adaptor has a first portion and a second portion away from the first portion towards a first direction by a first length. The first portion connects to the base. A probe holder connects to the second portion and extends towards a second direction opposite to the first direction by a second length. The probe connects to an end of the probe holder away from the second portion and extends towards the second direction by a third length. A product of a thermal coefficient of the adaptor and the first length is equal to a sum of a product of a thermal coefficient of the probe holder and the second length and a product of a thermal coefficient of the probe and the third length.

16 Claims, 7 Drawing Sheets

PROBE STATION CAPABLE OF MAINTAINING POSITION OF PROBE TIP UPON TEMPERATURE CHANGE

BACKGROUND

Technical Field

The present disclosure relates to probe stations.

Description of Related Art

As the demand for electronic devices has been increasing nowadays, the quality of the components of the electronic devices correspondingly becomes an important issue of the semiconductor industry. Apart from the improving technology of manufacture for the components, the accuracy of testing for the components has also become more important.

For example, wafer probe stations are in general used to test the quality of the wafers or dies in the semiconductor industry. Hence, the operational accuracy of wafer probe stations is undoubtedly concerned.

SUMMARY

A technical aspect of the present disclosure is to provide a probe station, which can easily maintain the position of the probe tip relative to the base after a temperature increase or a temperature decrease.

According to an embodiment of the present disclosure, a probe station includes a base, at least one adaptor, at least one probe holder and at least one probe. The adaptor has a first connecting portion and a second connecting portion. The second connecting portion is away from the first connecting portion towards a first direction by a first length. The first connecting portion is connected to the base. The probe holder is connected to the second connecting portion. The probe holder at least partially extends towards a second direction by a second length. The second direction is opposite to the first direction. The probe is connected to an end of the probe holder away from the second connecting portion. The probe at least partially extends towards the second direction by a third length. A product of a first thermal coefficient of the adaptor and the first length is equal to a sum of a product of a second thermal coefficient of the probe holder and the second length and a product of a third thermal coefficient of the probe and the third length.

In one or more embodiments of the present disclosure, the first thermal coefficient of the adaptor is different from the second thermal coefficient of the probe holder.

In one or more embodiments of the present disclosure, the first thermal coefficient of the adaptor is different from the third thermal coefficient of the probe.

In one or more embodiments of the present disclosure, the second thermal coefficient of the probe holder and the third thermal coefficient of the probe are the same.

In one or more embodiments of the present disclosure, the second thermal coefficient of the probe holder and the third thermal coefficient of the probe are different from each other.

In one or more embodiments of the present disclosure, a sum of the second length of the probe holder and the third length of the probe is larger than the first length of the adaptor.

In one or more embodiments of the present disclosure, a sum of the second length of the probe holder and the third length of the probe is smaller than the first length of the adaptor.

In one or more embodiments of the present disclosure, a portion of the adaptor defining the first length, a portion of the probe holder defining the second length and a portion of the probe defining the third length are parallel with each other.

In one or more embodiments of the present disclosure, the probe at least partially extends towards a third direction. The third direction is perpendicular to the second direction.

In one or more embodiments of the present disclosure, a quantity of the adaptor is plural. A quantity of the probe holder is plural. A quantity of the probe is plural. An end of the each of the probes away from the corresponding probe holder defines a probe tip. A distance between at least two of the probe tips is independent of a temperature change of the adaptors, the probe holders and the probes.

In one or more embodiments of the present disclosure, the probe station further includes a platen and a positioner. The positioner is connected between the base and the platen.

According to another embodiment of the present disclosure, a probe station includes a base, at least one adaptor, at least one fixing structure, at least one probe holder and at least one probe. The adaptor has a first connecting portion and a second connecting portion. The second connecting portion is away from the first connecting portion towards a first direction by a first length. The first connecting portion is connected to the base. The fixing structure is connected to the second connecting portion. The fixing structure is thermally resistant. The probe holder is connected to the fixing structure. The probe holder at least partially extends towards a second direction by a second length. The second direction is opposite to the first direction. The probe is connected to an end of the probe holder away from the fixing structure. The probe at least partially extends towards the second direction by a third length. The adaptor, the probe holder and the probe have the same thermal coefficient. The first length is equal to a sum of the second length and the third length.

In one or more embodiments of the present disclosure, the adaptor, the probe holder and the probe are of the same material.

In one or more embodiments of the present disclosure, a portion of the adaptor defining the first length, a portion of the probe holder defining the second length and a portion of the probe defining the third length are parallel with each other.

In one or more embodiments of the present disclosure, the probe at least partially extends towards a third direction. The third direction is perpendicular to the second direction.

In one or more embodiments of the present disclosure, the probe station further includes a platen and a positioner. The positioner is connected between the base and the platen.

When compared with the prior art, the above-mentioned embodiments of the present disclosure have at least the following advantages:

(1) By designing the product of the first thermal coefficient and the first length of the adaptor to be equal to the sum of the product of the second thermal coefficient and the second length of the probe holder and the product of the third thermal coefficient and the third length of the probe, the position of the probe tip relative to the base can be easily maintained after the probe station experiences the temperature change which can be an increase or a decrease.

(2) The position of the probe tip relative to the base can be maintained after the probe station experiences the temperature change, no matter what the magnitude of the temperature change is.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
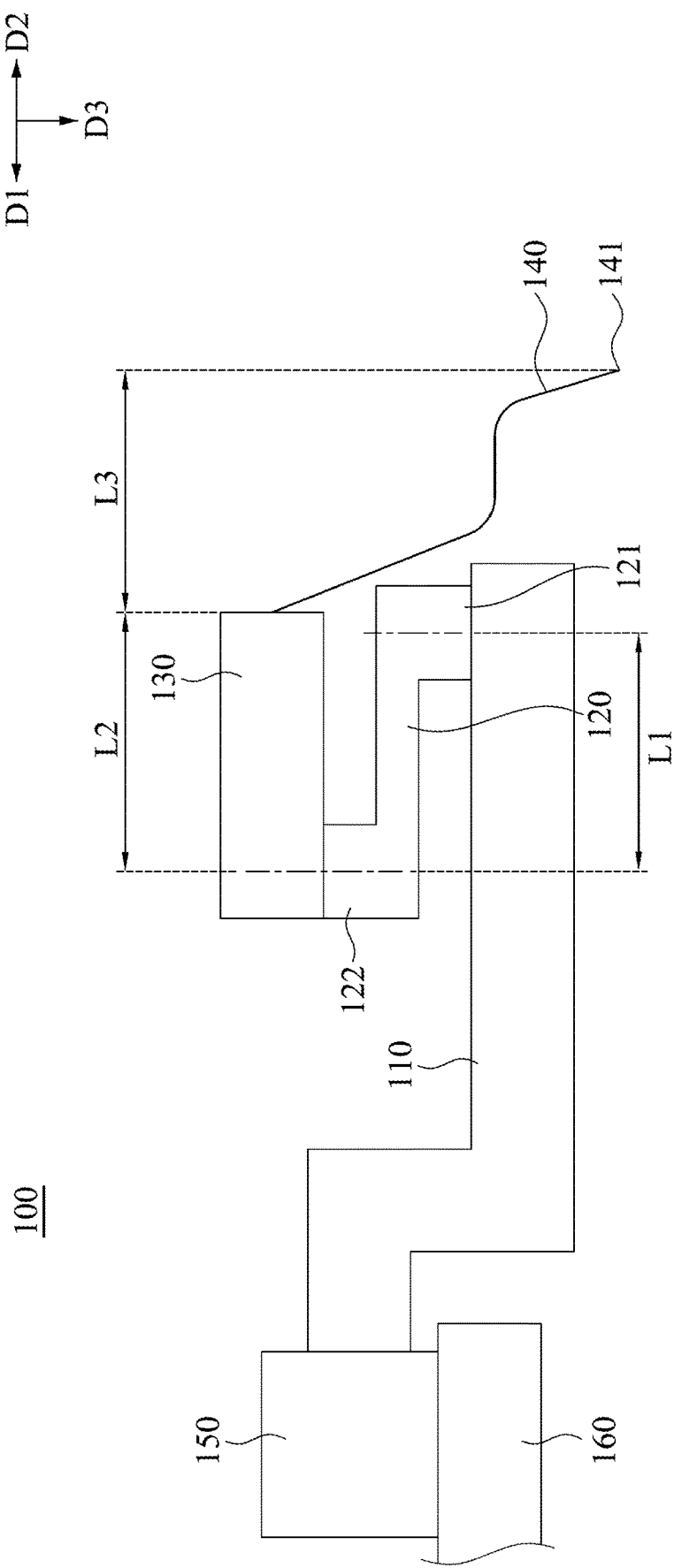
FIG. 1 is a schematic view of a probe station according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is a schematic view of a probe station 100 according to an embodiment of the present disclosure. In this embodiment, as shown in FIG. 1, a probe station 100 includes a base 110, an adaptor 120, a probe holder 130, a probe 140, a positioner 150 and a platen 160. The adaptor 120 has a first connecting portion 121 and a second connecting portion 122. The second connecting portion 122 is away from the first connecting portion 121 towards a first direction D1 by a first length L1. The first connecting portion 121 of the adaptor 120 is connected to the base 110. The base 110 is connected to the positioner 150, in which the positioner 150 is connected to the platen 160. In other words, the positioner 150 is connected between the base 110 and the platen 160. To be specific, the base 110 has a very low coefficient of thermal expansion and can be in practice a probe arm or a substrate of a probe card. The probe holder 130 is connected to the second connecting portion 122 of the adaptor 120. The probe holder 130 at least partially extends towards a second direction D2 by a second length L2. The second direction D2 is opposite to the first direction D1. The probe 140 is connected to an end of the probe holder 130 away from the second connecting portion 122 of the adaptor 120. The probe 140 at least partially extends towards the second direction D2 by a third length L3. An end of the probe 140 away from the probe holder 130 defines a probe tip 141. The adaptor 120 functions to compensate with the thermal expansion or contraction of the probe holder 130 and the probe 140, and the detail is described below.

Figure 2:
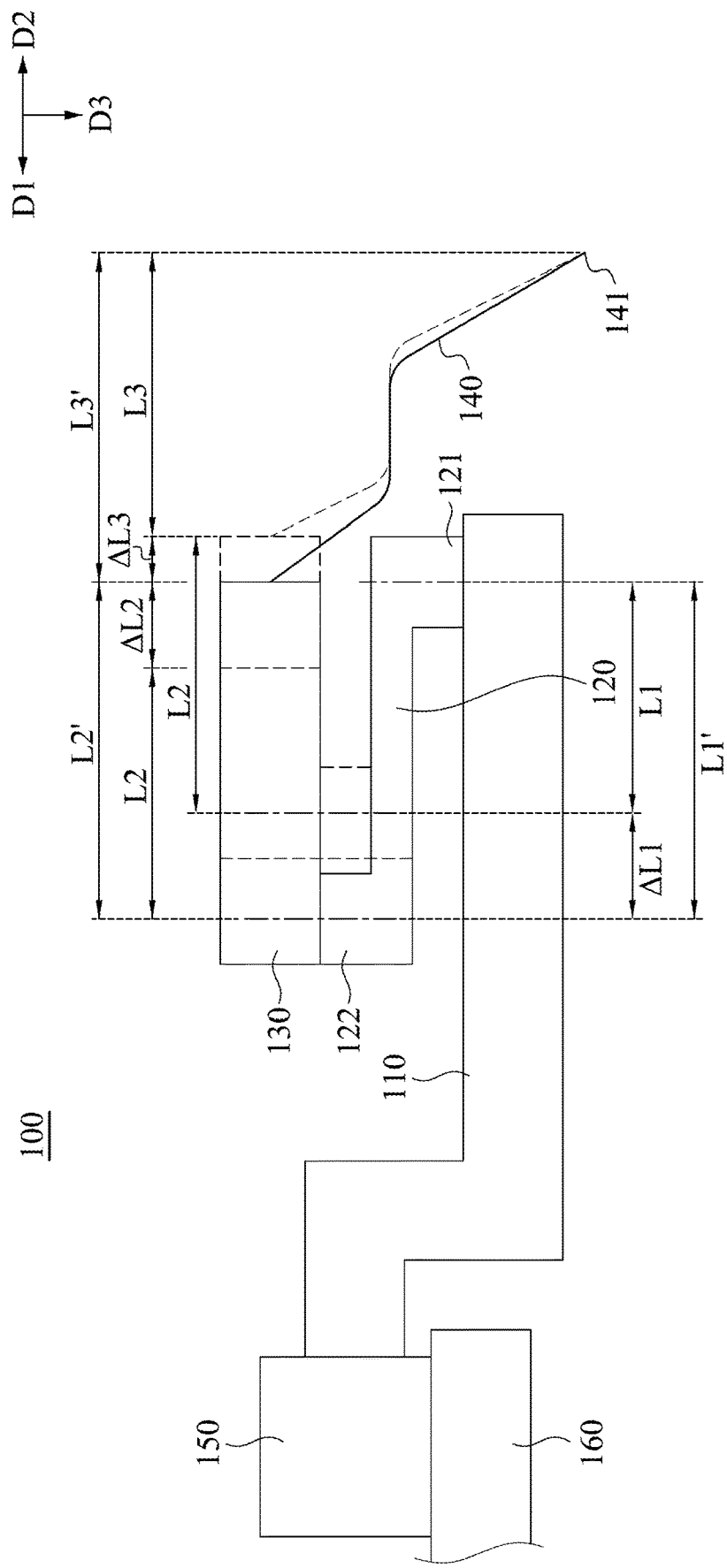
FIG. 2 is a schematic view of the probe station of FIG. 1 after a temperature change.

Reference is made to FIG. 2. FIG. 2 is a schematic view of the probe station 100 of FIG. 1 after a temperature change. In practical applications, a temperature change can be an increase or a decrease in temperature, depending on the actual situation. Taking an increase in temperature as an example, as shown in FIG. 2, when the adaptor 120 is heated up by a temperature change $\Delta T$, the adaptor 120 thermally expands and results in a length increment $\Delta L1$ towards the first direction D1 such that the first length L1 of the adaptor 120 changes to a new first length L1'. The shape of the adaptor 120 before the temperature change $\Delta T$ is presented in hidden lines. The new first length L1' is the sum of the first length L1 and the length increment $\Delta L1$. The ratio of the length increment $\Delta L1$ to the first length L1 per the temperature change $\Delta T$ is the first thermal coefficient $\alpha 1$ of the adaptor 120. Please be noted that the first thermal coefficient $\alpha 1$ of the adaptor 120 is also equal to the ratio of the length deduction of the adaptor 120 towards the second direction D2 due to thermal contraction to the first length L1 per the temperature change $\Delta T$ in the case that the adaptor 120 is cooled down by the temperature change $\Delta T$.

Similarly, as shown in FIG. 2, when the probe holder 130 is heated up by a temperature change $\Delta T$, the probe holder 130 thermally expands and results in a length increment $\Delta L2$ towards the second direction D2 such that the second length L2 of the probe holder 130 changes to a new second length L2'. The shape of the probe holder 130 before the temperature change $\Delta T$ is presented in hidden lines. The new second length L2' is the sum of the second length L2 and the length increment $\Delta L2$. The ratio of the length increment $\Delta L2$ to the second length L2 per the temperature change $\Delta T$ is the second thermal coefficient $\alpha 2$ of the probe holder 130. Please be noted that the second thermal coefficient $\alpha 2$ of the probe holder 130 is also equal to the ratio of the length deduction of the probe holder 130 towards the first direction D1 due to thermal contraction to the second length L2 per the temperature change $\Delta T$ in the case that the probe holder 130 is cooled down by the temperature change $\Delta T$.

Moreover, as shown in FIG. 2, when the probe 140 is heated up by a temperature change $\Delta T$, the probe 140 thermally expands and results in a length increment $\Delta L3$ towards the second direction D2 such that the third length L3 of the probe 140 changes to a new third length L3'. The shape of the probe 140 before the temperature change $\Delta T$ is presented in hidden lines. The new third length L3' is the sum of the third length L3 and the length increment $\Delta L3$. The ratio of the length increment $\Delta L3$ to the third length L3 per the temperature change $\Delta T$ is the third thermal coefficient $\alpha 3$ of the probe 140. Please be noted that the third thermal coefficient $\alpha 3$ of the probe 140 is also equal to the ratio of the length deduction of the probe 140 towards the first direction D1 due to thermal contraction to the third length L3 per the temperature change $\Delta T$ in the case that the probe 140 is cooled down by the temperature change $\Delta T$.

It is worth to note that, in this embodiment, a product of the first thermal coefficient $\alpha 1$ of the adaptor 120 and the first length L1 is equal to a sum of a product of the second thermal coefficient $\alpha 2$ of the probe holder 130 and the second length L2 and a product of the third thermal coefficient $\alpha 3$ of the probe 140 and the third length L3. Mathematically, this relation as described above can be expressed in the equation listed below:

$$\alpha1 \times L1 = \alpha2 \times L2 + \alpha3 \times L3$$

To be specific, keep taking an increase in temperature as an example. Provided that the adaptor 120, the probe holder 130 and the probe 140 are heated up by the same temperature change ΔT, the length increment ΔL1 of the adaptor 120 towards the first direction D1 is equal to the sum of the length increment ΔL2 of the probe holder 130 and the length increment ΔL3 of the probe 140 towards the second direction D2. In other words, under the condition that a portion of the adaptor 120 defining the first length L1, a portion of the probe holder 130 defining the second length L2 and a portion of the probe 140 defining the third length L3 are parallel with each other, the thermal expansion of the adaptor 120 towards the first direction D1 is compensated by the thermal expansions of the probe holder 130 and the probe 140 towards the second direction D2. As a result, the position of the probe tip 141 relative to the base 110 can be easily maintained after the probe station 100 experiences the temperature change ΔT.

It is worth to note that, the position of the probe tip 141 relative to the base 110 is maintained after the probe station 100 experiences the temperature change ΔT, no matter what the magnitude of the temperature change ΔT is.

Moreover, even if the temperature change ΔT is a decrease in temperature, provided that the adaptor 120, the probe holder 130 and the probe 140 are cooled down by the same temperature change ΔT, the thermal contraction of the adaptor 120 towards the second direction D2 is compensated by the thermal contractions of the probe holder 130 and the probe 140 towards the first direction D1, and thus the position of the probe tip 141 relative to the base 110 can also be easily maintained.

In practice, as shown in FIG. 1, a sum of the second length L2 of the probe holder 130 and the third length L3 of the probe 140 is larger than the first length L1 of the adaptor 120. Moreover, the first thermal coefficient α1 of the adaptor 120 is different from the second thermal coefficient α2 of the probe holder 130, while the first thermal coefficient α1 of the adaptor 120 is also different from the third thermal coefficient α3 of the probe 140.

In addition, provided that the product of the first thermal coefficient α1 and the first length L1 is equal to the sum of the product of the second thermal coefficient α2 and the second length L2 and the product of the third thermal coefficient α3 and the third length L3, as mentioned above, the second thermal coefficient α2 of the probe holder 130 and the third thermal coefficient α3 of the probe 140 can be the same or can be different from each other, depending on the actual situation.

In practical applications, as shown in FIGS. 1-2, the probe 140 at least partially extends towards a third direction D3. The third direction D3 is perpendicular to the second direction D2 and also the first direction D1. Thus, the probe tip 141 of the probe 140 can be practically adopted to contact a device under test (not shown) for testing.

It is worth to note that, by applying the same mechanism as described above, the position of the probe tip 141 relative to the base 110 can be maintained three-dimensionally after the temperature change ΔT. To be specific, apart from maintaining the position of the probe tip 141 relative to the base 110 along the first direction D1 or the second direction D2, the position of the probe tip 141 relative to the base 110 along the third direction D3 and the direction into or out of the paper on FIGS. 1-2 can also be maintained after the temperature change ΔT.

Figure 3:
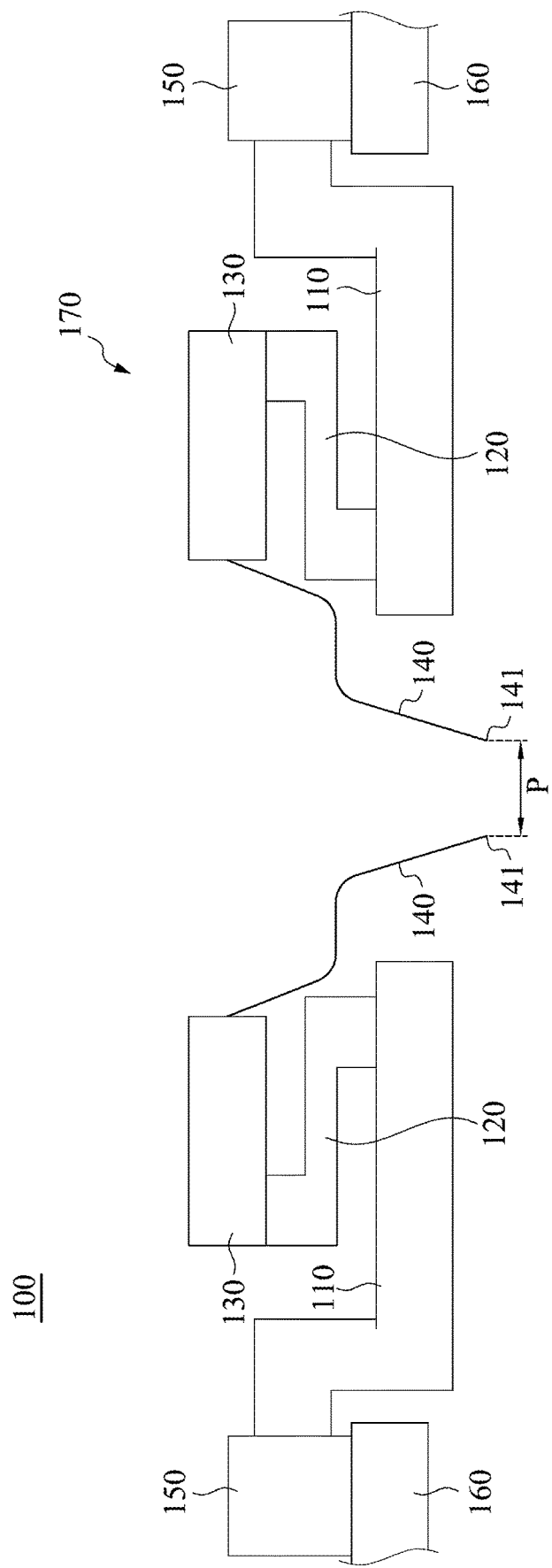
FIG. 3 is a schematic view of a probe station according to a further embodiment of the present disclosure.

Reference is made to FIG. 3. FIG. 3 is a schematic view of a probe station 100 according to a further embodiment of the present disclosure. In this embodiment, as shown in FIG. 3, a probe card 170 is adopted and the probe card 170 includes a plurality of the adaptors 120, a plurality of the probe holders 130, and a plurality of the probes 140. An end of the each of the probes 140 away from the corresponding probe holder 130 defines the probe tip 141, as mentioned above. For example, as shown in FIG. 3, there are two of the probe tips 141. It is worth to note that, by applying the same mechanism as described above, the distance P between two of the probe tips 141 is independent of the temperature change ΔT of the adaptors 120, the probe holders 130 and the probes 140. In other words, the distance P between two of the probe tips 141 remains unchanged no matter there is an increase or a decrease in temperature of the adaptors 120, the probe holders 130 and the probes 140.

Figure 4:
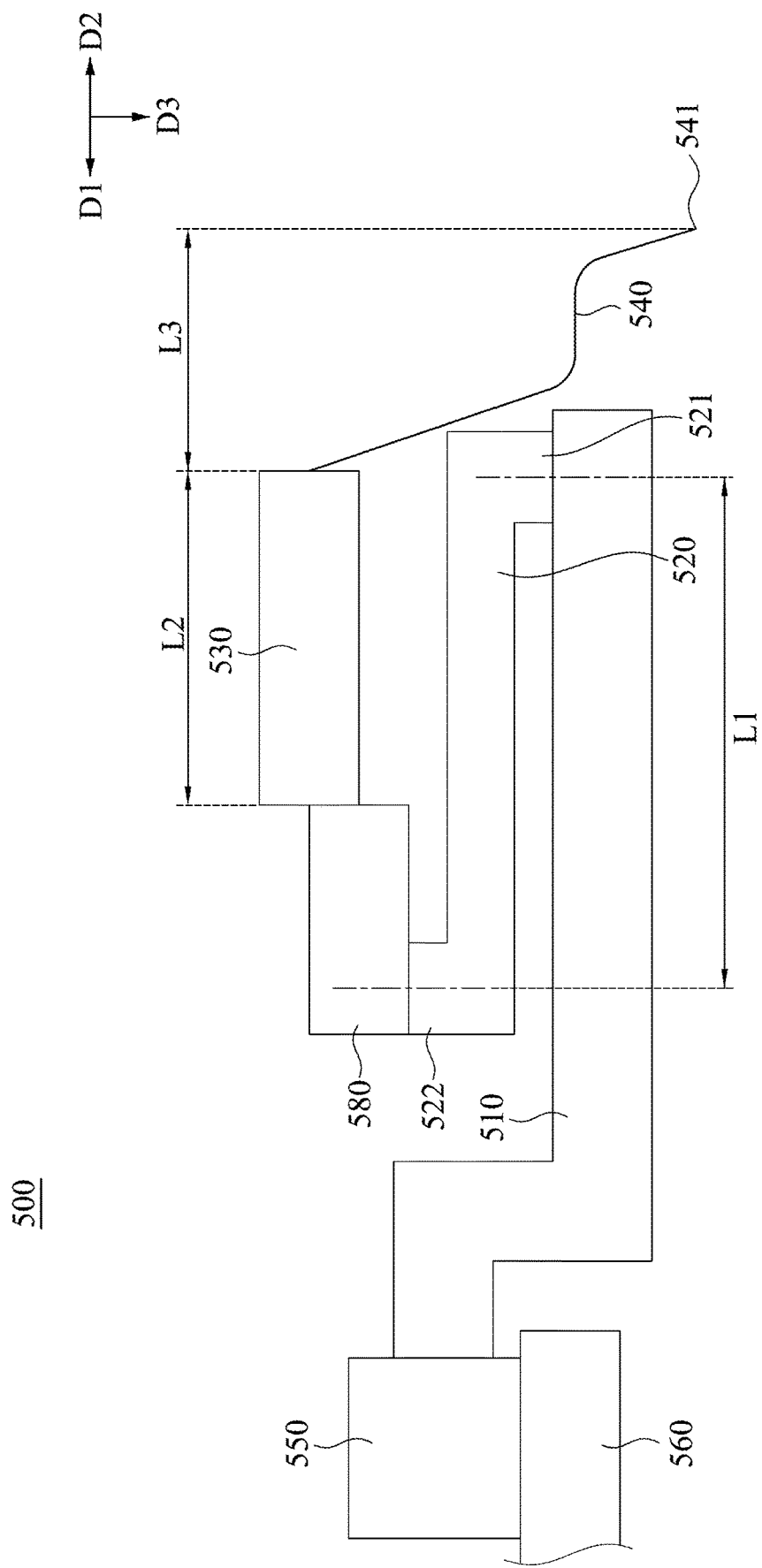
FIG. 4 is a schematic view of a probe station according to another embodiment of the present disclosure.

Reference is made to FIG. 4. FIG. 4 is a schematic view of a probe station 500 according to an embodiment of the present disclosure. In this embodiment, as shown in FIG. 4, a probe station 500 includes a base 510, an adaptor 520, a fixing structure 580, a probe holder 530, a probe 540, a positioner 550 and a platen 560. The adaptor 520 has a first connecting portion 521 and a second connecting portion 522. The second connecting portion 522 is away from the first connecting portion 521 towards a first direction D1 by a first length L1. The first connecting portion 521 of the adaptor 520 is connected to the base 510. The base 510 is connected to the positioner 550, in which the positioner 550 is connected to the platen 560. In other words, the positioner 550 is connected between the base 510 and the platen 560. To be specific, the base 510 has a very low coefficient of thermal expansion and can be in practice a probe arm or a substrate of a probe card. The fixing structure 580 is connected to the second connecting portion 522 of the adaptor 520. The fixing structure 580 is thermally resistant, which means the fixing structure 580 substantially remains unchanged in dimensions when heated up or cooled down. In practice, the fixing structure 580 is of the same material as the base 510 which has a very low coefficient of thermal expansion as mentioned above. The probe holder 530 is connected to the fixing structure 580. The probe holder 530 at least partially extends towards a second direction D2 by a second length L2. The second direction D2 is opposite to the first direction D1. The probe 540 is connected to an end of the probe holder 530 away from the fixing structure 580. The probe 540 at least partially extends towards the second direction D2 by a third length L3. An end of the probe 540 away from the probe holder 530 defines a probe tip 541. The adaptor 520 functions to compensate with the thermal expansion or contraction of the probe holder 530 and the probe 540, and the detail is described below.

It is worth to note that, in this embodiment, the adaptor 520, the probe holder 530 and the probe 540 have the same thermal coefficient α4. In practical applications, for example, the adaptor 520, the probe holder 530 and the probe 540 are of the same material. On the other hand, the first length L1 of the adaptor 520 is equal to a sum of the second length L2 of the probe holder 530 and the third length L3 of the probe 540. Moreover, as mentioned above, since the fixing structure 580 is thermally resistant, the thermal coefficient of the fixing structure 580 is substantially equal to zero.

Figure 5:
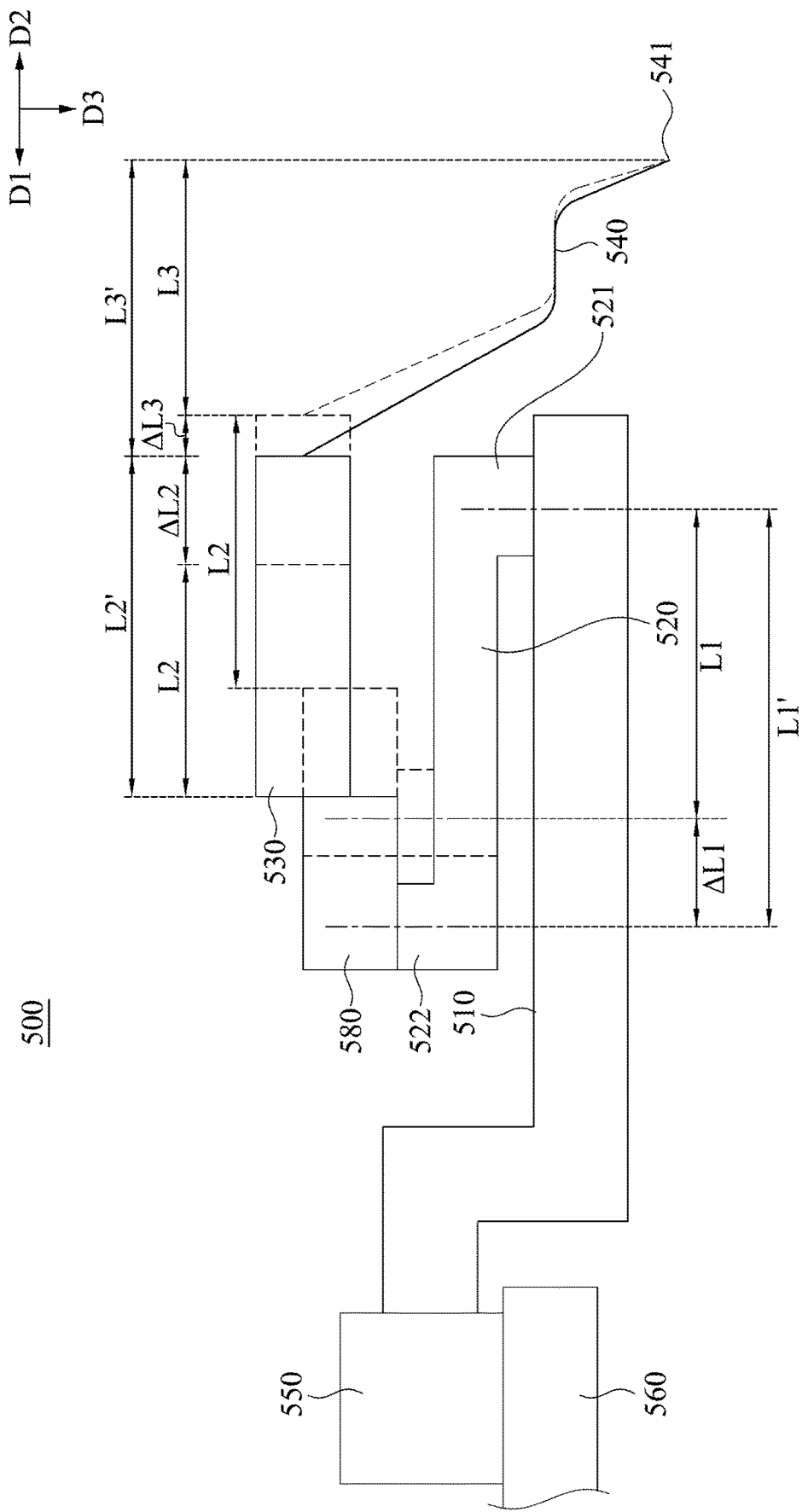
FIG. 5 is a schematic view of the probe station of FIG. 4 after a temperature change.

Reference is made to FIG. 5. FIG. 5 is a schematic view of the probe station 500 of FIG. 4 after a temperature change. Similarly, in practical applications, a temperature change can be an increase or a decrease in temperature, depending on the actual situation. Taking an increase in temperature as an example, as shown in FIG. 5, when the adaptor 520 is heated up by a temperature change ΔT, the adaptor 520 thermally expands and results in a length increment ΔL1 towards the first direction D1 such that the first length L1 of the adaptor 520 changes to a new first length L1'. The shape of the adaptor 520 before the temperature change ΔT is presented in hidden lines. The length increment ΔL1 is the product of the thermal coefficient α4 and the first length L1 of the adaptor 520. The new first length L1' is the sum of the first length L1 and the length increment ΔL1.

Moreover, as shown in FIG. 5, when the probe holder 530 is heated up by a temperature change ΔT, the probe holder 530 thermally expands and results in a length increment ΔL2 towards the second direction D2 such that the second length L2 of the probe holder 530 changes to a new second length L2'. The shape of the probe holder 530 before the temperature change ΔT is presented in hidden lines. The length increment ΔL2 is the product of the thermal coefficient α4 and the second length L2 of the adaptor 520. The new second length L2' is the sum of the second length L2 and the length increment ΔL2.

In addition, as shown in FIG. 5, when the probe 540 is heated up by a temperature change ΔT, the probe 540 thermally expands and results in a length increment ΔL3 towards the second direction D2 such that the third length L3 of the probe 540 changes to a new third length L3'. The shape of the probe 540 before the temperature change ΔT is presented in hidden lines. The length increment ΔL3 is the product of the thermal coefficient α4 and the third length L3 of the probe 540. The new third length L3' is the sum of the third length L3 and the length increment ΔL3.

As mentioned above, the adaptor 520, the probe holder 530 and the probe 540 have the same thermal coefficient α4, while the thermal coefficient of the fixing structure 580 is substantially equal to zero. Moreover, the first length L1 of the adaptor 520 is equal to a sum of the second length L2 of the probe holder 530 and the third length L3 of the probe 540. Thus, upon the same temperature change ΔT, the length increment ΔL1 is equal to the sum of the length increment ΔL2 and the length increment ΔL3. Mathematically, this relation can be expressed in the equation listed below:

$$\alpha 4 \times L1 = \alpha 4 \times L2 + \alpha 4 \times L3$$

To be specific, keep taking an increase in temperature as an example. Provided that the adaptor 520, the probe holder 530 and the probe 540 are heated up by the same temperature change ΔT, under the condition that a portion of the adaptor 520 defining the first length L1, a portion of the probe holder 530 defining the second length L2 and a portion of the probe 540 defining the third length L3 are parallel with each other, the thermal expansion of the adaptor 520 towards the first direction D1 is compensated by the thermal expansions of the probe holder 530 and the probe 540 towards the second direction D2, while the thermal expansion of the fixing structure 580 is neglected. As a result, the position of the probe tip 541 relative to the base 510 can be easily maintained after the probe station 500 experiences the temperature change ΔT.

Similarly, it is worth to note that, the position of the probe tip 541 relative to the base 510 is maintained after the probe station 500 experiences the temperature change ΔT, no matter what the magnitude of the temperature change ΔT is.

Moreover, even if the temperature change ΔT is a decrease in temperature, provided that the adaptor 520, the probe holder 530 and the probe 540 are cooled down by the same temperature change ΔT, the thermal contraction of the adaptor 520 towards the second direction D2 is compensated by the thermal contractions of the probe holder 530 and the probe 540 towards the first direction D1, and thus the position of the probe tip 541 relative to the base 510 can also be easily maintained.

In practical applications, as shown in FIGS. 4-5, the probe 540 at least partially extends towards a third direction D3. The third direction D3 is perpendicular to the second direction D2 and also the first direction D1. Thus, the probe tip 541 of the probe 540 can be practically adopted to contact a device under test (not shown) for testing.

It is worth to note that, by applying the same mechanism as described above, the position of the probe tip 541 relative to the base 510 can be maintained three-dimensionally after the temperature change ΔT. To be specific, apart from maintaining the position of the probe tip 541 relative to the base 510 along the first direction D1 or the second direction D2, the position of the probe tip 541 relative to the base 510 along the third direction D3 and the direction into or out of the paper on FIGS. 4-5 can also be maintained after the temperature change ΔT.

Figure 6:
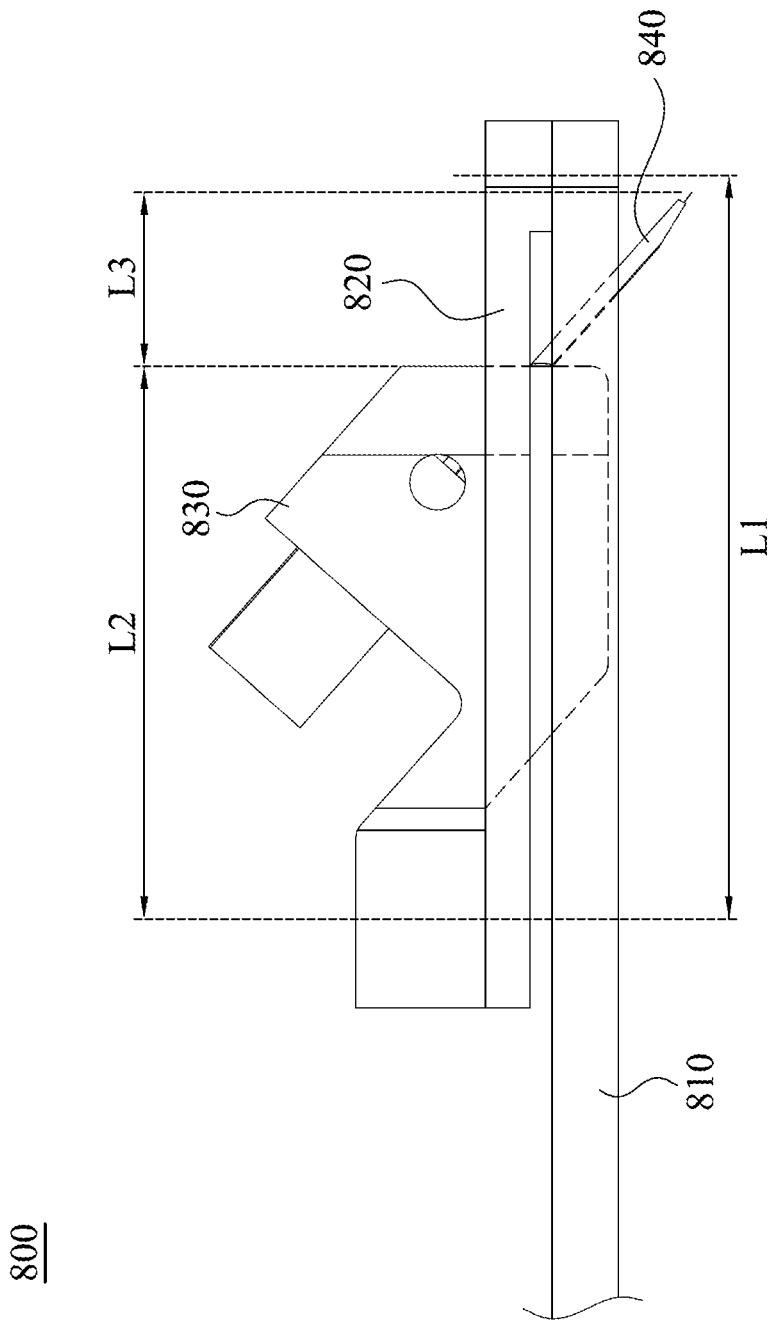
FIG. 6 is a schematic view of a probe station according to a further embodiment of the present disclosure.
Figure 7:
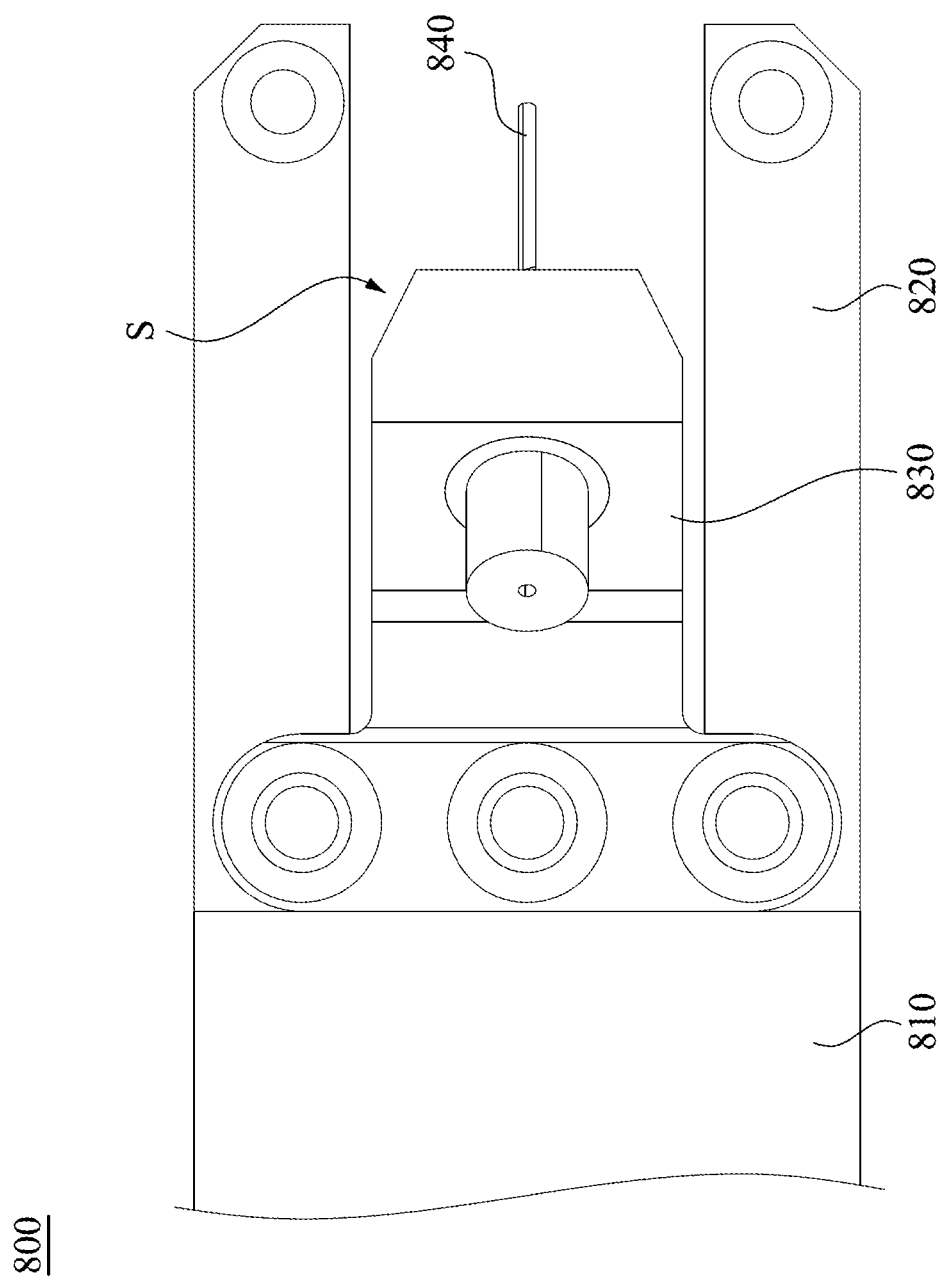
FIG. 7 is a top view of the probe station of FIG. 6.

Reference is made to FIGS. 6-7. FIG. 6 is a schematic view of a probe station 800 according to a further embodiment of the present disclosure. FIG. 7 is a top view of the probe station 800 of FIG. 6. In this embodiment, as shown in FIG. 6, the adaptor 820 is connected to the base 810. Both the adaptor 820 and the base 810 have a U-shaped structure. The U-shaped structures of the adaptor 820 and the base 810 together define a space S which allows the probe holder 830 and the probe 840 to at least partially locate therein. Moreover, a sum of the second length L2 of the probe holder 830 and the third length L3 of the probe 840 is smaller than the first length L1 of the adaptor 820.

In conclusion, when compared with the prior art, the aforementioned embodiments of the present disclosure have at least the following advantages:

(1) By designing the product of the first thermal coefficient and the first length of the adaptor to be equal to the sum of the product of the second thermal coefficient and the second length of the probe holder and the product of the third thermal coefficient and the third length of the probe, the position of the probe tip relative to the base can be easily maintained after the probe station experiences the temperature change which can be an increase or a decrease.

(2) The position of the probe tip relative to the base can be maintained after the probe station experiences the temperature change, no matter what the magnitude of the temperature change is.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:
1. A probe station, comprising:
 a base;
 at least one adaptor having a first connecting portion and a second connecting portion away from the first con- necting portion towards a first direction by a first length, the first connecting portion connecting to the base;

at least one probe holder connecting to the second connecting portion and at least partially extending towards a second direction opposite to the first direction by a second length; and at least one probe connecting to an end of the probe holder away from the second connecting portion and at least partially extending towards the second direction by a third length, wherein a product of a first thermal coefficient of the adaptor and the first length is equal to a first sum of a product of a second thermal coefficient of the probe holder and the second length and a product of a third thermal coefficient of the probe and the third length, and wherein a first variation of the first length of the adaptor towards the first direction is equal to a second sum of a second variation of the second length of the probe holder towards the second direction and a third variation of the third length of the probe towards the second direction, such that a probe tip of the probe maintains at a position relative to the base in at least one of the first direction and the second direction by a same first temperature change of the adaptor, the probe holder and the probe.

2. The probe station of claim 1, wherein the first thermal coefficient of the adaptor is different from the second thermal coefficient of the probe holder.

3. The probe station of claim 1, wherein the first thermal coefficient of the adaptor is different from the third thermal coefficient of the probe.

4. The probe station of claim 1, wherein the second thermal coefficient of the probe holder and the third thermal coefficient of the probe are the same.

5. The probe station of claim 1, wherein the second thermal coefficient of the probe holder and the third thermal coefficient of the probe are different from each other.

6. The probe station of claim 1, wherein a sum of the second length of the probe holder and the third length of the probe is larger than the first length of the adaptor.

7. The probe station of claim 1, wherein a sum of the second length of the probe holder and the third length of the probe is smaller than the first length of the adaptor.

8. The probe station of claim 1, wherein a portion of the adaptor defining the first length, a portion of the probe holder defining the second length and a portion of the probe defining the third length are parallel with each other.

9. The probe station of claim 1, wherein the probe at least partially extends towards a third direction perpendicular to the second direction.

10. The probe station of claim 1, wherein a quantity of the adaptor is plural, a quantity of the probe holder is plural, a quantity of the probe is plural, an end of the each of the probes away from the corresponding probe holder defines the probe tip, a distance between at least two of the probe tips is independent of a same second temperature change of the adaptors, the probe holders and the probes.

11. The probe station of claim 1, further comprising:
a platen; and
a positioner connected between the base and the platen.

12. A probe station, comprising:
a base;
at least one adaptor having a first connecting portion and a second connecting portion away from the first connecting portion towards a first direction by a first length, the first connecting portion connecting to the base;

at least one fixing structure connecting to the second connecting portion and being thermally resistant;

at least one probe holder connecting to the fixing structure and at least partially extending towards a second direction opposite to the first direction by a second length; and at least one probe connecting to an end of the probe holder away from the fixing structure and at least partially extending towards the second direction by a third length, wherein the adaptor, the probe holder and the probe have a same first thermal coefficient, and the first length is equal to a first sum of the second length and the third length, wherein a second thermal coefficient of the fixing structure is less than the first thermal coefficient, and wherein a first variation of the first length of the adaptor towards the first direction is equal to a second sum of a second variation of the second length of the probe holder towards the second direction and a third variation of the third length of the probe towards the second direction, such that a probe tip of the probe maintains at a position relative to the base in at least one of the first direction and the second direction by a same first temperature change of the adaptor, the probe holder, the probe and the fixing structure.

13. The probe station of claim 12, wherein the adaptor, the probe holder and the probe are of the same material.

14. The probe station of claim 12, wherein a portion of the adaptor defining the first length, a portion of the probe holder defining the second length and a portion of the probe defining the third length are parallel with each other.

15. The probe station of claim 12, wherein the probe at least partially extends towards a third direction perpendicular to the second direction.

16. The probe station of claim 12, further comprising:
a platen; and
a positioner connected between the base and the platen.

* * * * *